(12) United States Patent
Janko et al.

(10) Patent No.: US 9,082,923 B2
(45) Date of Patent: Jul. 14, 2015

(54) METHOD AND APPARATUS FOR ENHANCING VORTEX PINNING BY CONFORMAL CRYSTAL ARRAYS

(71) Applicant: University of Notre Dame du Lac, Notre Dame, IN (US)

(72) Inventors: Boldizsar Janko, Granger, IN (US); Cynthia Reichhardt, Los Alamos, NM (US); Charles Reichhardt, Los Alamos, NM (US); Dipanjan Ray, Santa Fe, NM (US)

(73) Assignees: University of Notre Dame du Lac, Notre Dame, IN (US); Los Alamos National Laboratory, LLC, Los Alamos, NM (US)

( * ) Notice: Subject to any disclaimer, the term of this patent is extended or adjusted under 35 U.S.C. 154(b) by 0 days.

(21) Appl. No.: 14/201,131

(22) Filed: Mar. 7, 2014

(65) Prior Publication Data

US 2014/0302996 A1    Oct. 9, 2014

Related U.S. Application Data

(60) Provisional application No. 61/851,488, filed on Mar. 8, 2013.

(51) Int. Cl.
*H01L 39/02* (2006.01)
*H01L 39/14* (2006.01)
*H01L 39/24* (2006.01)

(52) U.S. Cl.
CPC .......... *H01L 39/148* (2013.01); *H01L 39/2483* (2013.01)

(58) Field of Classification Search
CPC ............... H01L 6/06; H01L 6/00; H01L 6/02; H01L 41/048
See application file for complete search history.

(56) References Cited

U.S. PATENT DOCUMENTS

| 4,803,310 | A * | 2/1989 | Zeitlin et al. ............ 174/125.1 |
| 5,226,947 | A * | 7/1993 | Jablonski et al. ............ 75/245 |
| 5,504,138 | A | 4/1996 | Jacobs |
| 6,469,880 | B1 * | 10/2002 | Barabasi et al. ............ 361/19 |
| 6,787,798 | B1 * | 9/2004 | Andrews et al. ............ 257/48 |
| 2007/0118320 | A1 | 5/2007 | Luo et al. |

FOREIGN PATENT DOCUMENTS

EP    0553593    8/1993

OTHER PUBLICATIONS

International Search Report and Written Opinion mailed on Aug. 29, 2014, re International Application No. PCT/US2014/22686, 8 pgs.

(Continued)

*Primary Examiner* — Colleen Dunn
(74) *Attorney, Agent, or Firm* — Greenberg Traurig, LLP

(57) ABSTRACT

Disclosed is a method and apparatus for strongly enhancing vortex pinning by conformal crystal arrays. The conformal crystal array is constructed by a conformal transformation of a hexagonal lattice, producing a non-uniform structure with a gradient where the local six-fold coordination of the pinning sites is preserved, and with an arching effect. The conformal pinning arrays produce significantly enhanced vortex pinning over a much wider range of field than that found for other vortex pinning geometries with an equivalent number of vortex pinning sites, such as random, square, and triangular.

24 Claims, 7 Drawing Sheets

(56) References Cited

OTHER PUBLICATIONS

Yaouanc et al. "Effect of the vortex core on the magnetic field in hard superconductors." Physical Review B, vol. 55, No. 17, May 1, 1997, The American Physical Society, pp. 11 107-110.

Lerner "Vortex pinning could lead to superconducting breakthroughs." Argonne National Laboratory, Feb. 12, 2013, 4 pgs.

Rosenstein et al. "Transport current carrying superconducting film with periodic pinning array under strong magnetic fields." Phsyical Review B 83, 064512 (2011), Feb. 22, 2011, pp. 065412,1-8.

International Preliminary Report on Patentability re PCT/US14/22686, Dated Mar. 4, 2015, 3 pgs.

\* cited by examiner

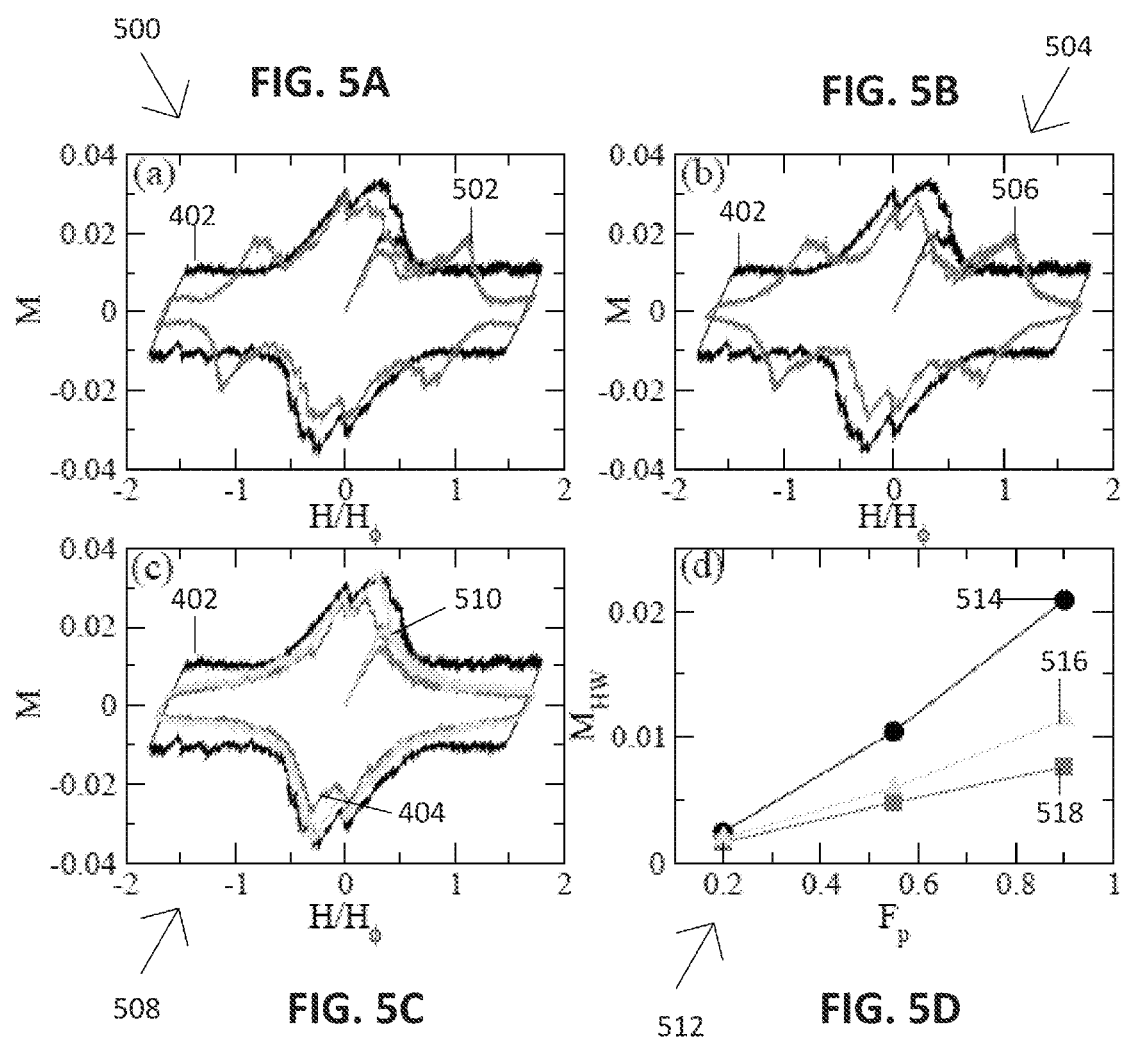

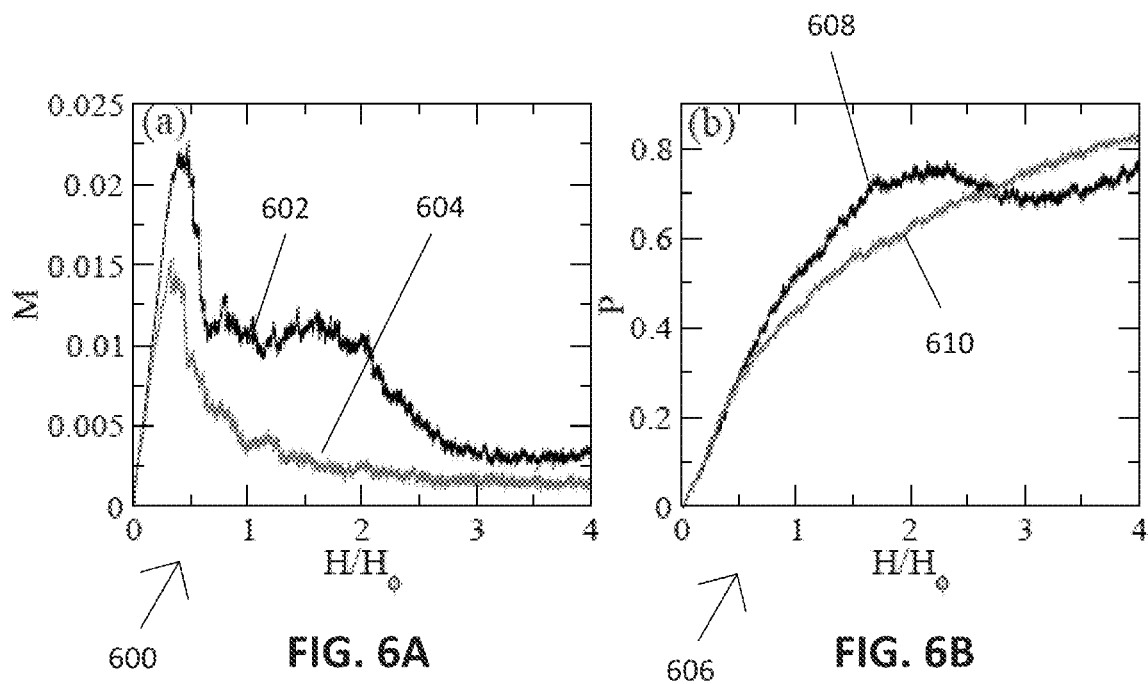

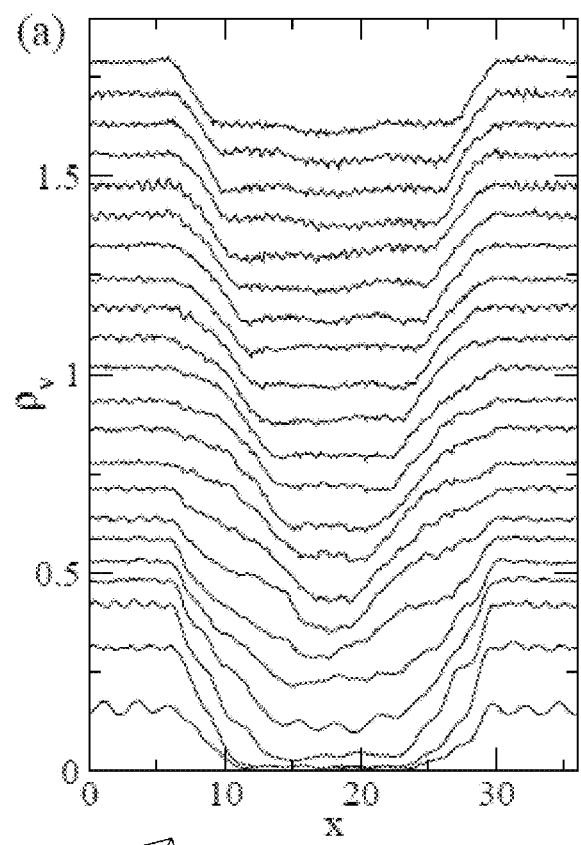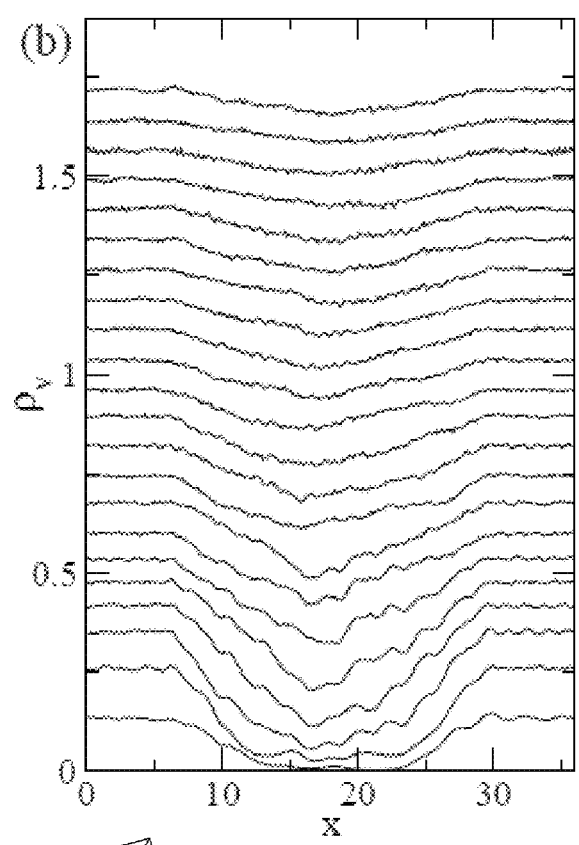
FIG. 7A  
700
FIG. 7B  
702

METHOD AND APPARATUS FOR ENHANCING VORTEX PINNING BY CONFORMAL CRYSTAL ARRAYS

CROSS REFERENCE TO RELATED APPLICATION

This application is a non-provisional application claiming priority from U.S. Provisional Application Ser. No. 61/851,488 filed Mar. 8, 2013, entitled "Conformal Artificial Pinning Array for Enhanced Pinning of Superconducting Vortices" and incorporated herein by reference in its entirety.

GOVERNMENT LICENSE RIGHTS

This invention was made with government support under Grant No. DE-AC52-06NA25396 awarded by the Department of Energy and Grant No. LDRD-20100273ER awarded by Los Alamos National Laboratory. The government has certain rights in the invention.

FIELD OF THE DISCLOSURE

The present description relates generally to vortex pinning and more particularly to systems and methods for enhancing vortex pinning by conformal crystal arrays.

BACKGROUND OF RELATED ART

The known industrial application of high-temperature superconductors (type-II superconductors) is at present still quite restricted. In these superconductors, magnetic fields create vortices that allow superconducting current to travel around these formed vortices up until a certain critical point. Eventually, as the magnetic field strengthens, or as the critical current or temperature is exceeded, the vortices begin to move about and interfere with the material's superconductivity, introducing resistance. One way to immobilize vortices and recover zero resistance at high magnetic fields is vortex pinning. However, decades of research have, to the best of knowledge, failed to yield strong vortex pinning over a wide range of applied magnetic fields.

For over sixty years, it has been understood that the ground state vortex structure is a hexagonal lattice. Subsequently, methods have been developed in an attempt to increase the critical current using uniform pinning arrays (i.e. holes or indentations) that incorporate periodicity to match the vortex structure. In these methods, pinning is enhanced at commensurate fields when the number of vortices equals an integer multiple of the number of pinning sites, but away from these specific matching fields, the enhancement of the critical current is lost.

Therefore, it would be advantageous to develop a vortex pinning arrangement that potentially exhibits a stronger vortex pinning effect over a much larger range of magnetic field than found in traditional periodic and/or random pinning arrangements.

BRIEF DESCRIPTION OF THE DRAWINGS

FIG. 5A is an example plot M vs $H/H_\phi$ of example hysteresis loops for an example conformal pinning array and an example uniform square vortex pinning array.

FIG. 5B is an example plot M vs $H/H_\phi$ of example hysteresis loops for an example conformal pinning array and an example uniform triangular vortex pinning array.

FIG. 5C is an example plot M vs $H/H_\phi$ of example hysteresis loops for an example conformal pinning array and an example random vortex pinning array with an equivalent vortex pinning gradient.

FIG. 5D is an example plot $M_{HW}$ vs. $F_p$ for an example conformal pinning array, an example random vortex pinning array with an equivalent vortex pinning gradient, and an example uniform random vortex pinning array.

FIG. 6A illustrates an example plot of M vs $H/H_\phi$ for an example conformal pinning array and an example uniform random vortex pinning array in the first quarter of the magnetization loop.

FIG. 6B illustrates an example plot of P vs $H/H_\phi$ for an example conformal pinning array and an example uniform random vortex pinning array in the first quarter of the magnetization loop.

FIG. 7A illustrates an example plot of the flux density profiles obtained by averaging the flux density in the y direction for the first ramp up of the field in a hysteresis loop for an example conformal pinning array.

FIG. 7B illustrates an example plot of the flux density profiles for an example uniformly dense random vortex pinning array.

DETAILED DESCRIPTION

The following description of example methods and apparatus is not intended to limit the scope of the description to the precise form or forms detailed herein. Instead the following description is intended to be illustrative so that others may follow its teachings. Unless defined otherwise, all technical and scientific terms used herein have the same meaning as commonly understood by one of ordinary skill in the art to which this disclosure belongs.

The present disclosure describes a novel vortex pinning arrangement, created, for example, by using a conformal transformation of a uniform hexagonal lattice. The disclosed vortex pinning arrangement generally may exhibit a substantially stronger vortex pinning effect over a much larger range of magnetic fields than any known pinning geometry. In one example, the novel vortex pinning arrangement is a conformal crystal pattern comprising a density gradient, while preserving aspects of the hexagonal ordering naturally adopted by a vortex lattice. One having ordinary skill in the art will appreciate that other local pin orderings besides hexagonal ordering may be used. For example, the local pin ordering may be any polygon, or other suitable arrangement as desired. Still further, although the present disclosure is described in the context of a conformal crystal array applied in the area of type-II superconductors, one having ordinary skill in the art will also appreciate that the disclosed pinning enhancement may be useful for a wide range of applications, including, for example, controlling flux and/or stabilizing self-assembled structures created using density gradients, such as in colloidal systems.

In at least one example, the disclosed conformal crystal array is distinguished from known periodic vortex pinning arrays because even though local hexagonal ordering is present in periodic arrays, the overall arc-like arrangement of present vortex pinning sites in the conformal crystal array (apparent in FIGS. 2 and 3) substantially prevents the formation of straight-line channels along which vortices can easily flow.

Figure 1:
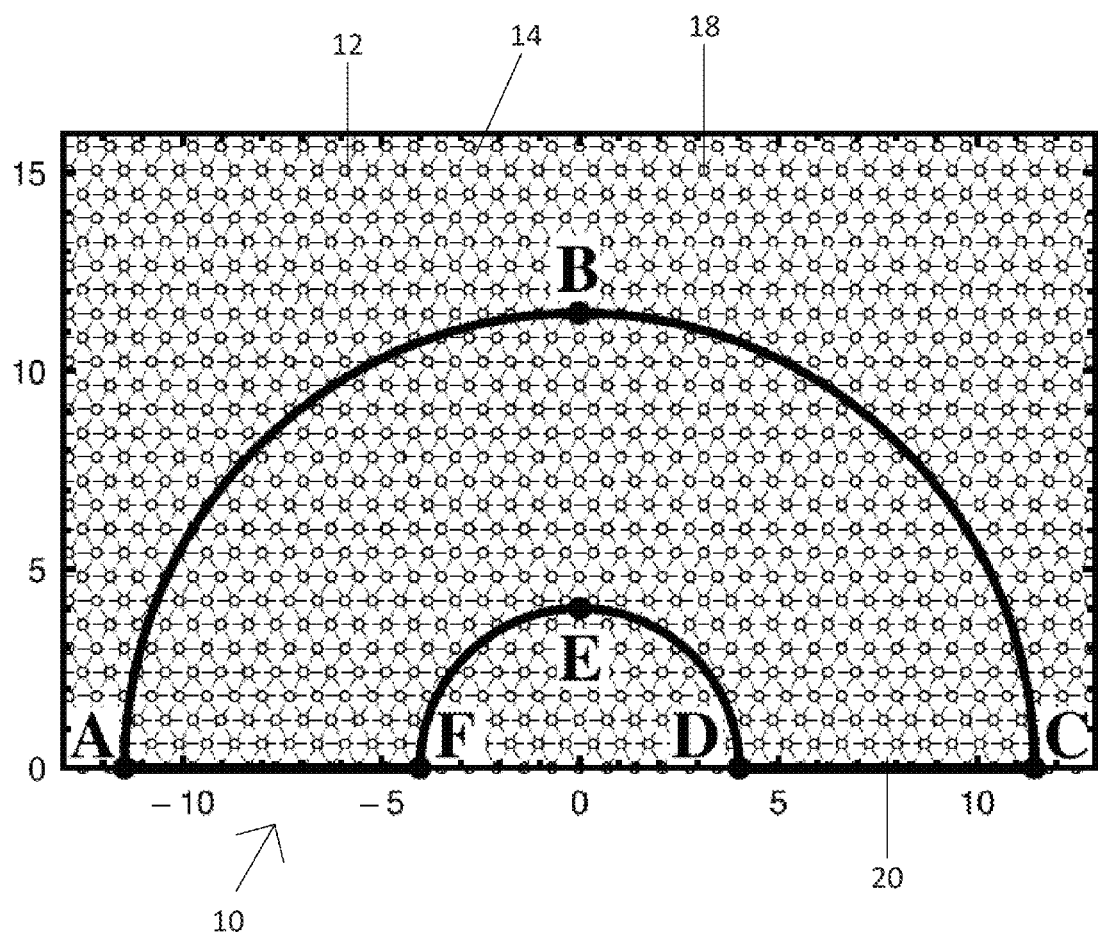
FIG. 1 is an example of a prior art hexagonal lattice vortex pinning pattern.

Referring now to the figures, a superconductor having a conformal crystal array of the present disclosure may be generally described as a two-dimensional (2D) map created by the application of a conformal (angle-preserving) transformation to a regular lattice in the complex plane. For instance, FIG. 1 illustrates a regular hexagonal lattice 10 that is known in the prior art. Individual vortex pinning sites 12 are arranged on a surface of a superconducting material 13 so that adjacent vortex pinning sites form a hexagon. As is evident, contour lines 14 connecting nearest neighboring vortex pinning sites 12 are straight lines.

Figure 2:
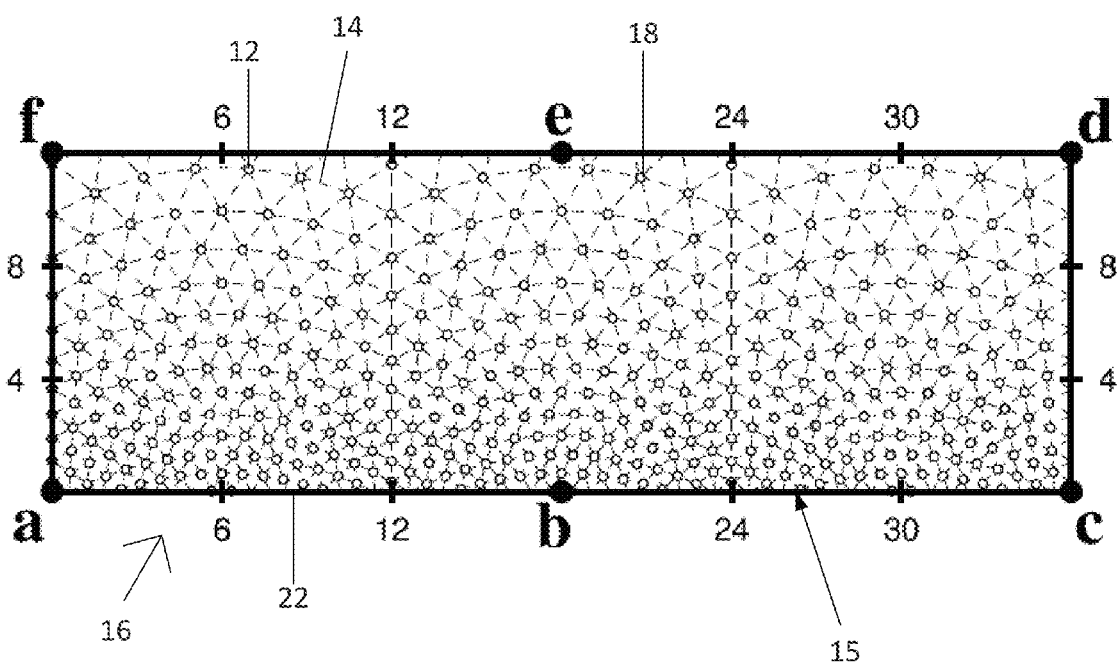
FIG. 2 is an example conformal transformation of the example hexagonal lattice vortex pinning pattern of FIG. 1.

FIG. 2 illustrates a top plan view of a superconducting material 15 having an example conformal crystal pattern 16 formed on a surface via the conformal transformation of the known regular hexagonal lattice 10 illustrated in FIG. 1. In the present example, the surface of the superconducting material 15 comprises a plurality of vortex pinning sites 12 patterned along the surface of the superconducting material 15 in accordance with the conformal crystal pattern 16. In the example conformal crystal pattern 16, contour lines 14 connecting nearest neighboring vortex pinning sites 12 are bent into arcs but still cross at angles of $\pi/3$, preserving the six-fold coordination of individual vortex pinning sites 12 in spite of the clear density gradient. To create the example conformal crystal pattern 16, the vortex pinning sites 12 are placed at vertex locations 18 where the contour lines 14 intersect.

One having ordinary skill in the art will appreciate that the regular hexagonal lattice 10 may be replaced by any type of polygonal lattice, including, for example, an irregular polygonal lattice, an equiangular polygonal lattice, a regular polygonal lattice, etc. Furthermore, one having ordinary skill in the art will appreciate that the polygon may be any type of polygon, including, for example, a square, a pentagon, a hexagon, a heptagon, etc. Moreover, one having ordinary skill in the art will appreciate that the contour lines 14 are merely illustrative, and appear in FIGS. 1 and 2 simply to demonstrate where the vortex pinning sites 12 are to be placed. Also, one having ordinary skill in the art will appreciate that the superconducting material 15 may be any type of suitable superconducting material and may be of any thickness. For example, the superconducting material 15 may be a thin film formed on a non-superconducting substrate.

In one example of the present disclosure, to obtain the conformal crystal pattern 16, a regular hexagonal lattice 10 is situated in the complex plane by encoding the location (x, y) of each of the vortex pinning sites 12 into a complex number $z=x=iy$. With lattice constant (b), the vortex pinning sites 12 will be located at $$z = n_1 \cdot (1 \cdot b) + n_2 \cdot (e^{\frac{i\pi}{3}} \cdot b) \qquad \text{Eq. 1}$$

where $n_1$ and $n_2$ are arbitrary integers.

A conformal (angle-preserving) transformation mapping z to w E u≡iv is applied to a semi-annular region 20 (defined in FIG. 1 by points ABCDEF) of the regular hexagonal lattice 10, the conformal transformation given by $$w = \left(\frac{\pi}{2\alpha}\right) + \left(\frac{1}{i\alpha}\right) \ln(i\alpha z) \qquad \text{Eq. 2}$$

where $\alpha \equiv 1/r_{out}$. The semi-annular region 20 in the z-plane is mapped to a rectangular region 22 (defined in FIG. 2 by points abcdef) in the w-plane specified by $0 \le u \le \pi r_{out}$ and $$0 \le v \le r_{out} \ln\left(\frac{r_{out}}{r_{in}}\right).$$

The structure of the final conformal crystal pattern 16 is completely determined by specifying three constants b, $r_{out}$, and $r_{in}$. The locations of the vortex pinning sites 12 of the conformal crystal pattern 16 can be generated directly by the expressions $$u = r_{out} \cdot \left\{\left(\frac{\pi}{2}\right) - \tan^{-1}\left(\frac{2n_1 + n_2}{n_2\sqrt{3}}\right)\right\} \qquad \text{Eq. 3}$$

$$v = r_{out} \ln\left(r_{out} / \left(b\sqrt{n_1^2 + n_2^2 + n_1 n_2}\right)\right) \qquad \text{Eq. 4}$$

where $(n_1, n_2)$ range over all pairs of integers satisfying the two constraints, $n_2 \ge 0$ and $r_{in}^2 \le b^2(n_1^2 + n_2^2 + n_1 n_2) \le r_{out}^2$. To obtain a conformal crystal pattern 16 of length $u_{max}$ and width $v_{max}$, one chooses $r_{out}$ and $r_{in}$ to have the values $$r_{out} = \left(\frac{u_{max}}{\pi}\right), r_{in} = \left(\frac{u_{max}}{\pi}\right) \exp\left(-\frac{\pi v_{max}}{u_{max}}\right).$$

b can be chosen to obtain a desired final density (ρ) of the vortex pinning sites 12

$$b^2 = \frac{1 - \left(\frac{r_{in}}{r_{out}}\right)^2}{\rho\sqrt{3} \cdot \ln\left(\frac{r_{out}}{r_{in}}\right)} \qquad \text{Eq. 5}$$

Alternatively, b can be set equal to a desired minimum distance between the vortex pinning sites 12 in the final conformal crystal pattern 16.

The dynamics of vortex (i) are obtained by integrating the overdamped equation $$\eta\left(\frac{dR_i}{dt}\right) = F_i^{vv} + F_i^{vp} \qquad \text{Eq. 6}$$

η is the damping constant which is set equal to unity. The vortex-vortex interaction force is $$F_i^{vv} = \sum_{i=1}^{N_v} s_i s_j F_0 K_1\left(\frac{R_{ij}}{\lambda}\right) \hat{R}_{ij} \qquad \text{Eq. 7}$$

where $K_1$ is the modified Bessel function, $R_i$ is the location of vortex i, $R_{ij} = |R_i - R_j|$, $$\hat{R}_{ij} = \frac{R_i - R_j}{R_{ij}},$$

$F_0 = \phi_0^2 \pi \mu_0 \lambda^3$, and $\phi_0$ is the elementary flux quantum. The sign prefactor ($s_i$) is +1 for a vortex and −1 for an anti-vortex. The vortex pinning sites 12 are modeled as $N_\eta$ non-overlapping parabolic traps with $$F_i^{vp} = \sum_{k=1}^{N_p} \left( \frac{F_p R_{ik}^p}{R_p} \right) \Theta((R_p - R_{ik}^p)/\lambda) \hat{R}_{ik}^p \qquad \text{Eq. 8}$$

where $R_k^p$ is the location of vortex pinning site k, $R_{ik}^p = |R_i - R_k^p|$, $\hat{R}_{ik}^p = (R_i - R_k^p)/R_{ik}^p$, $\Theta$ is the Heaviside step function, $R_\rho$ is the pinning radius fixed to $R_\rho = 0.12\lambda$, and $F_\rho$ is an adjustable parameter controlling the strength of the vortex pinning force. All forces are measured in units of $F_0$ and all lengths in units of $\lambda$. The external field is measured in units of $H_\phi$, the field at which the average unit density of vortices equals the average unit density of vortex pinning sites 12.

Figure 3:
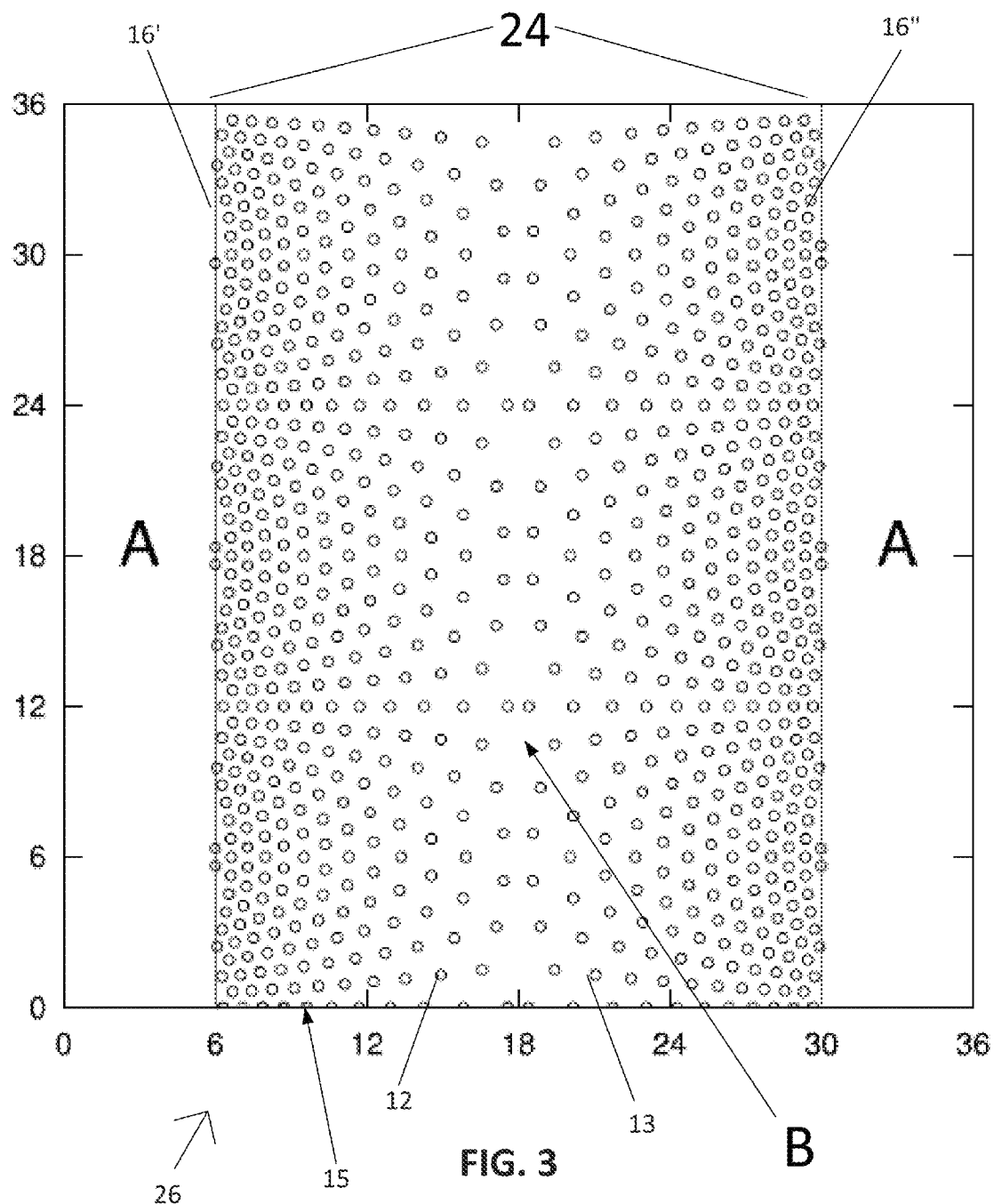
FIG. 3 is a top view of an example conformal pinning array.

FIG. 3 illustrates a conformal pinning array (CPA) 24 formed by mapping two conformal crystal patterns 16', 16" oriented with their lowest density regions adjacent to each other onto a superconducting material 15. One having ordinary skill in the art will appreciate that the disclosed vortex pinning enhancement may be achieved regardless of the type or thickness of the superconducting material 15 selected. Moreover, although one having ordinary skill in the art will appreciate that some superconducting materials may be applied as a thin film onto a non-superconducting substrate, the disclosed vortex pinning enhancement may still be achieved in these situations.

Once the conformal crystal patterns 16', 16" are mapped onto the superconducting material 15, defects 13 may be formed in the surface of the superconducting material 15 at the vortex pinning sites 12, thus forming the CPA 24. One having ordinary skill in the art will appreciate that the defects 13 may be placed into the superconducting material 15 using any appropriate method or technique, including, for example, focused ion beams, electron beams, etc. Although the defects 13 of the illustrated example are shown as holes, one having ordinary skill in the art will appreciate that the desired vortex pinning enhancement may be achieved using defects 13 of any type, including, for example, dents, rods of non-superconducting material, etc. Moreover, one having ordinary skill in the art will appreciate that, if the defects 13 are holes, the holes may be formed at any depth. Furthermore, although the defects 13 of the illustrated example are of the same size, type and depth, one having ordinary skill in the art will appreciate that the desired vortex pinning enhancement may be achieved when the size, type and/or depth of the defects 13 varies across the vortex pinning sites 12 of the CPA 24. In one example, the defects 13 exhibiting the strongest pinning effects (i.e. holes) are placed near the edges (e.g. perimeter) of the CPA 24, and the defects 13 exhibiting weaker pinning effects (i.e. dents or non-superconducting rods) are placed near the interior of the CPA 24.

FIG. 3 further illustrates a system 26 with an outer pin free region A surrounding the CPA 24 is a 36λ×36λ system with a pinned region B extending from x=6λ to 30λ, where λ is the penetration depth. A complete field sweep is performed by beginning with zero vortex density and then quasi-statically adding vortices in the outer pin free region A at randomly chosen non-overlapping positions until the desired maximum external field value is reached. As the vortex or anti-vortex density builds up in the pin-free region A, the vortices or anti-vortices drive themselves into the pinned region B due to their own repulsive interactions, creating a gradient in the flux density within the pinned region B. Vortices are then removed from the outer pin free region A until the vortex density in the outer pin free region A reaches zero. To reverse the field, anti-vortices, which repel each other but are attracted to vortices, are added to the outer pin free region A. When a vortex and anti-vortex come within a small distance (0.3λ) of each other, they are both removed from the system 26 to simulate an annihilation event. To complete an entire magnetization loop, anti-vortices are added until the external field reaches its most negative value, and then anti-vortices are removed from the outer pin free region A to bring the external field back up to zero. The average magnetization (M), which is a measure of vortex pinning strength, is calculated as the difference between the flux density H in the outer pin free region A and the density B in the pinned region B, $$M = -\left(\frac{1}{4\pi V}\right) \int (H - B) dV \qquad \text{Eq. 9}$$

where V is the sample area. The critical current ($J_c$) is proportional to the magnetization.

The effectiveness of the CPA 24 was demonstrated by comparing the CPA 24 to random and periodic vortex pinning arrays with the same number of vortex pinning sites 12. The CPA 24 produced significantly stronger vortex pinning over a much larger range of magnetic fields than these other arrays. Furthermore, comparing the CPA 24 to random vortex pinning arrays with an equivalent density gradient demonstrated that both the non-uniform density and the preservation of the hexagonal ordering of the CPA 24 give rise to the vortex pinning enhancement.

Figure 4:
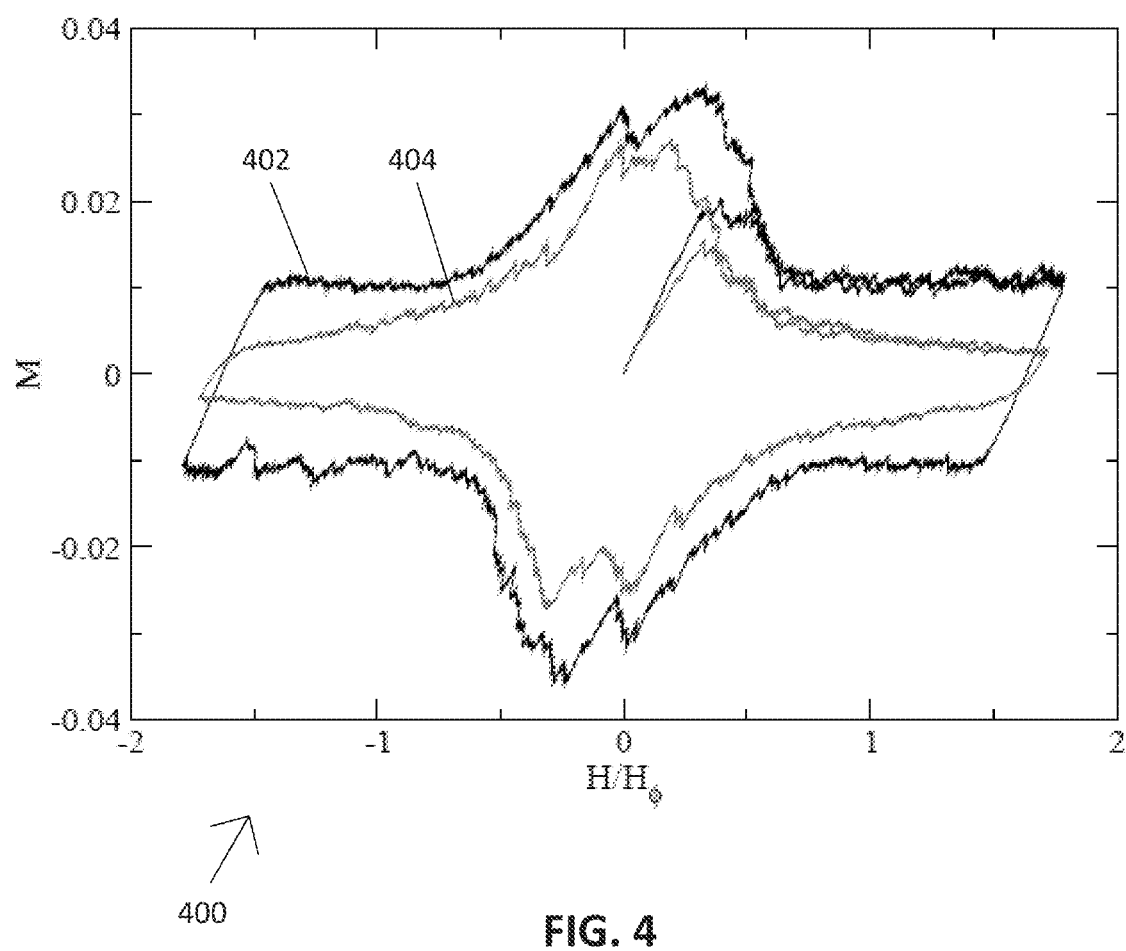
FIG. 4 is an example plot M vs $H/H_\phi$ of example hysteresis loops for an example conformal pinning array and an example uniformly dense random vortex pinning array.

FIG. 4 illustrates a graph 400 of a complete hysteresis loop M vs. H/$H_\phi$. Specifically a data plot 402 corresponds to data obtained from experimenting with the CPA 24, while a data plot 404 corresponds to data obtained from experimenting with a uniformly dense random vortex pinning array (not shown). In this experiment, both arrays contained the same number ($N_\rho$) of vortex pinning sites 12 with an average pinning density of $n_\rho = 1.0$ and with $F_\rho = 0.55$. As can be seen from FIG. 4, it is evident that M is much higher at all fields for the data plot 402 representing the CPA 24 than for the data plot 404 representing the uniformly dense random vortex pinning array (not shown), and that at its highest point, M for the data plot 402 representing the CPA 24 is almost four times higher than for the data plot 404 representing the uniformly dense random vortex pinning array (not shown). Although the vortex pinning sites 12 on the CPA 24 have local triangular ordering, the data plot 402 representing the CPA 24 does not exhibit any peaks or other anomalies in M at integer matching or fractional matching multiples of H/$H_\phi$ of the type found for uniformly dense periodic vortex pinning arrays (not shown).

FIG. 7A illustrates a graph 700 of flux density profiles obtained by averaging a flux density in the y direction for a first ramp up of the field in the hysteresis loop obtained from experimenting with the CPA 24, and FIG. 7B illustrates a graph 702 of the flux density profiles obtained from experimenting with the uniformly dense random vortex pinning array (not shown). As is evident in FIG. 7B, the graph 702 obtained from the uniformly dense random vortex pinning array (not shown) produces a Bean-like flux profile that becomes shallower as H increases. This shows that the uniformly dense random vortex pinning arrays (not shown) generally have a portion of the vortex pinning sites 12 that are not fully occupied. In contrast to uniform vortex pinning arrays, the CPA 24 of the present disclosure includes a density gradient to match the critical flux gradient. As is evident in FIG. 7A, at higher fields, the graph 700 obtained from the CPA 24 develops a double slope profile, with a larger flux gradient near the edge of the sample and a much shallower or nearly flat flux profile in the center of the sample. As H increases, the sharper slope region decreases in width and is replaced by the shallow slope region.

FIG. 5A illustrates a graph 500 of M vs $H/H_\phi$ including the data plot 402 representing the CPA 24, and a data plot 502 corresponding to data obtained from experimenting with a square vortex pinning array (not shown) with the same pinning density and strength as the CPA 24. FIG. 5B illustrates a similar graph 504 including the data plot 402 representing the CPA 24 and a data plot 506 corresponding to data obtained from experimenting with a triangular vortex pinning array (not shown). As is evident, in both cases, M for the data plot 402 representing the CPA 24 is higher over most of the range $H/H_\phi$ except at the first matching field, where the data plots 502, 506 representing the periodic vortex pinning arrays (not shown) produce a higher value of M. This shows that although periodic vortex pinning arrays can enhance vortex pinning to some extent, this enhancement occurs only for a very specific matching field. In contrast, the data plot 402 representing the CPA 24 exhibits a significant enhancement of the vortex pinning over a very broad range of fields, extending well above the first matching field.

FIG. 5C illustrates a graph 508 of M vs $H/H_\phi$ including the data plot 402 corresponding to the CPA 24, the data plot 404 representing the uniformly dense random vortex pinning array (not shown), and a data plot 510 corresponding to data obtained from experimenting with a random vortex pinning array with an equivalent vortex pinning gradient (not shown) and the same average pinning density as the CPA 24. As is evident in FIG. 5C, the data plot 510 corresponding to the random vortex pinning array with a gradient (not shown) exhibits a modest enhancement of M compared to the data plot 404 corresponding to the uniform random vortex pinning array (not shown). However, both the data plots 404, 510 corresponding to the random vortex pinning arrays (not shown) produce M values that are significantly smaller than for the data plot 402 representing the CPA 24 for all but the very lowest fields. This shows that the preservation of local six-fold ordering and the vortex pinning gradient are responsible for the enhanced vortex pinning in the CPA 24. The arching structure of the CPA 24 suppresses certain modes of vortex motion. For example, for random vortex pinning arrays it has been found that certain regions where the vortex pinning density is slightly lower lead to the formation of persistent river-like flow patterns. These structures are unable to form in the CPA 24. For periodic vortex pinning arrangements, easy vortex flow occurs along the symmetry directions of the pinning array, causing a drop in the critical current above a commensurate field. Such motion is suppressed in the CPA 24 due to the arching structure.

As shown in FIG. 5D, a graph 512 of $M_{HW}$ (the half-width of the magnetization loop at $$\left(\text{the half-width of the magnetization loop at } \frac{H}{H_\phi} = 1.0\right)$$

vs. $F_\rho$, the magnetization for a data plot 514 corresponding to the CPA 24 is consistently higher than for a data plot 516 corresponding to the random vortex pinning array with CPA-equivalent vortex pinning gradient (not shown) and for a data plot 518 corresponding to the uniform random vortex pinning array (not shown).

FIG. 6A illustrates a graph 600 of M vs $H/H_\phi$ in a first quarter of the magnetization loop over a much larger range of fields up to $$\frac{H}{H_\phi} = 4.0.$$

The graph 600 includes a data plot 602 corresponding to the CPA 24 and a data plot 604 corresponding to the uniform random vortex pinning array (not shown). FIG. 6B, meanwhile, illustrates a graph 606 of the corresponding pin occupancy (P), which is the fraction of vortex pinning sites 12 occupied by vortices. The graph 606 includes a data plot 608 representing the same CPA 24, and a data plot 610 representing the same uniform random vortex pinning array (not shown). As can be understood, the enhanced pinning for the data plot 608 representing the CPA 24 is the most pronounced below $$\frac{H}{H_\phi} = 2.0.$$

The enhancement decreases above this field, but remains larger than the data plot 610 representing the random vortex pinning array (not shown) for all fields. For the data plot 610 representing the random vortex pinning array (not shown), P monotonically increases over the entire range of $H/H_\phi$. In contrast, after running well above the P value for the data plot 610 representing the random vortex pinning array (not shown) at lower fields, P for the data plot 608 representing the CPA 24 rolls over and begins to decrease with increasing field above $$\frac{H}{H_\phi} \approx 2,$$

correlated with the decrease in M. Just below this field, all of the vortex pinning sites 12 near the edge of the sample are occupied, and since these vortex pinning sites 12 are the most closely spaced, as additional vortices enter the sample, the vortex-vortex interactions become strong enough to push some of the vortices out of the pins, leading to the drop in P and M. For the random vortex pinning array (not shown), there are always some empty vortex pinning sites 12 near the edge of the sample in places where two pins happen to be in close proximity, so that the vortex-vortex interaction energy would be prohibitively high if both pins were occupied simultaneously. As the field increases, these vortex pinning sites 12 gradually become occupied. Even though P for the data plot 608 representing the CPA 24 falls below P for the data plot 610 representing the random vortex pinning array (not shown) at higher fields, the vortex pinning enhancement remains significantly stronger for the CPA 24. One having ordinary skill in the art will appreciate that, even though FIGS. 4-7 were obtained using a magnetic field perpendicular to the CPA 24, the vortex pinning enhancement of the present disclosure may still be obtained in a tilted magnetic field.

Although certain example methods and apparatus have been described herein, the scope of coverage of this patent is not limited thereto. On the contrary, this patent covers all methods, apparatus, and articles of manufacture fairly falling within the scope of the appended claims either literally or under the doctrine of equivalents.

We claim:

1. A vortex pinning array comprising:
   a superconducting material including a surface, a perimeter, and an interior thereof; and
   a plurality of defects formed in the surface of the superconducting material at a plurality of vortex pinning sites, wherein the plurality of vortex pinning sites are patterned according to a conformal transformation of a polygonal lattice.

2. A vortex pinning array of claim 1 wherein the plurality of vortex pinning sites are patterned more densely at the perimeter of the superconducting material and less densely at the interior of the superconducting material.

3. A vortex pinning array of claim 1 wherein the plurality of defects are at least one of a plurality of holes, dents, or non-superconducting rods.

4. A vortex pinning array of claim 3 wherein the plurality of defects proximate the perimeter of the superconducting material are holes.

5. A vortex pinning array of claim 3 wherein the plurality of defects proximate the interior of the superconducting material are at least one of a plurality of dents or non-superconducting rods.

6. A vortex pinning array of claim 1 wherein the plurality of defects are uniform in at least one of a type, a size, or a depth.

7. A vortex pinning array of claim 6 wherein the plurality of defects are uniform in size, type, and depth.

8. A vortex pinning array of claim 1 wherein the polygonal lattice is an equiangular polygonal lattice.

9. A vortex pinning array of claim 8 wherein the equiangular polygonal lattice is an equiangular hexagonal lattice.

10. A vortex pinning array of claim 1 wherein the polygonal lattice is a regular polygonal lattice.

11. A vortex pinning array of claim 10 wherein the regular polygonal lattice is a regular hexagonal lattice.

12. A vortex pinning array of claim 1 wherein the superconducting material is a high-temperature superconducting material.

13. A method of creating a vortex pinning array in a superconductor comprising:
    providing a superconducting material including a surface, a perimeter and an interior thereof; and
    forming a plurality of defects in the surface of the superconducting material at a plurality of vortex pinning sites, wherein the plurality of vortex pinning sites are patterned on the surface of the superconducting material according to a conformal transformation of a polygonal lattice.

14. A method of claim 13 wherein the plurality of vortex pinning sites are patterned more densely at the perimeter of the superconducting material and less densely at the interior of the superconducting material.

15. A method of claim 13 wherein the plurality of defects are at least one of a plurality of holes, dents, or non-superconducting rods.

16. A method of claim 15 wherein the plurality of defects proximate the perimeter of the superconducting material are holes.

17. A method of claim 15 wherein the plurality of defects proximate the interior of the superconducting material are at least one of a plurality of dents or non-superconducting rods.

18. A method of claim 13 wherein the plurality of defects are uniform in at least one of a type, a size, or a depth.

19. A method of claim 13 wherein the plurality of defects are uniform in size, type, and depth.

20. A method of claim 13 wherein the polygonal lattice is an equiangular polygonal lattice.

21. A method of claim 20 wherein the equiangular polygonal lattice is an equiangular hexagonal lattice.

22. A method of claim 13 wherein the polygonal lattice is a regular polygonal lattice.

23. A method of claim 22 wherein the regular polygonal lattice is a regular hexagonal lattice.

24. A method of claim 13 wherein the superconducting material is a high-temperature superconducting material.

* * * * *